United States Patent
Evans et al.

(10) Patent No.: US 9,960,089 B2
(45) Date of Patent: May 1, 2018

(54) APPARATUS AND METHOD FOR ENDPOINT DETECTION

(71) Applicant: Varian Semiconductor Equipment Associates, Inc., Gloucester, MA (US)

(72) Inventors: Morgan Evans, Manchester, MA (US); Ross Bandy, Milton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 113 days.

(21) Appl. No.: 14/678,061

(22) Filed: Apr. 3, 2015

(65) Prior Publication Data
US 2016/0293503 A1    Oct. 6, 2016

(51) Int. Cl.
| | | |
|---|---|---|
| G03F 7/00 | (2006.01) | |
| H01L 21/66 | (2006.01) | |
| H01J 37/30 | (2006.01) | |
| H01J 37/32 | (2006.01) | |
| H01L 21/02 | (2006.01) | |
| H01L 21/265 | (2006.01) | |
| H01L 21/3065 | (2006.01) | |
| H01L 21/67 | (2006.01) | |
| H01L 21/223 | (2006.01) | |
| H01L 21/311 | (2006.01) | |

(52) U.S. Cl.
CPC ............. *H01L 22/26* (2013.01); *H01J 37/30* (2013.01); *H01J 37/32935* (2013.01); *H01J 37/32963* (2013.01); *H01L 21/02104* (2013.01); *H01L 21/265* (2013.01); *H01L 21/3065* (2013.01); *H01L 21/67253* (2013.01); *H01J 2237/30* (2013.01); *H01J 2237/334* (2013.01); *H01L 21/2236* (2013.01); *H01L 21/31116* (2013.01)

(58) Field of Classification Search
CPC ........................................................ G03F 7/00
See application file for complete search history.

(56) References Cited

U.S. PATENT DOCUMENTS

| | | | |
|---|---|---|---|
| 6,057,602 A | 5/2000 | Hudson et al. | |
| 2005/0029227 A1 | 2/2005 | Champan | |
| 2005/0185171 A1* | 8/2005 | Samukawa | ....... H01J 37/32963 356/237.1 |
| 2008/0026488 A1 | 1/2008 | Panda et al. | |
| 2013/0052810 A1 | 2/2013 | Darby et al. | |

FOREIGN PATENT DOCUMENTS

WO    03044842 A1    5/2003

OTHER PUBLICATIONS

International Search Report and Written Opinion issued in corresponding international patent application No. PCT/US2016/021453.

* cited by examiner

*Primary Examiner* — Mohammad Choudhry

(57) ABSTRACT

An apparatus to control processing conditions for a substrate. The apparatus may include a current measurement component to perform a plurality of extraction current measurements for extraction current in a processing apparatus housing the substrate, the extraction current comprising ions extracted from a plasma and directed to the substrate; and an endpoint detection component comprising logic to generate an endpoint detection signal based upon a change in extraction current during the plurality of extraction current measurements.

13 Claims, 8 Drawing Sheets

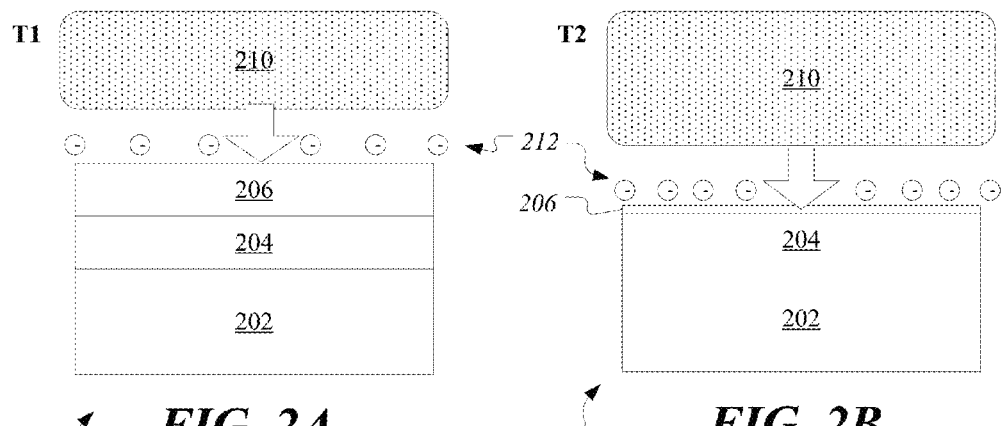
FIG. 2A  FIG. 2B
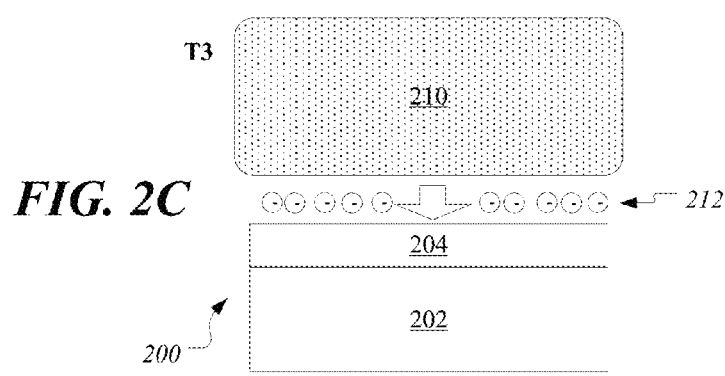
FIG. 2C
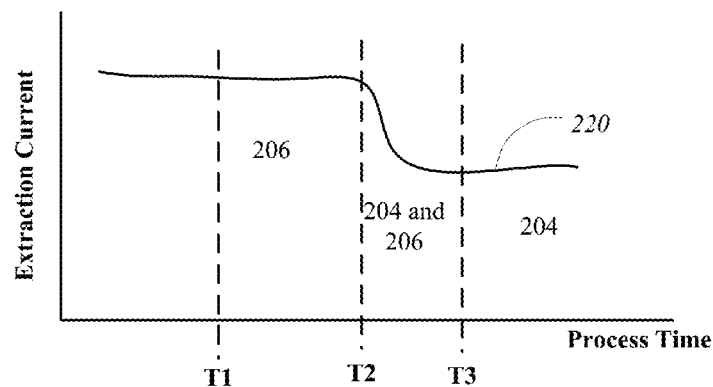
FIG. 2D

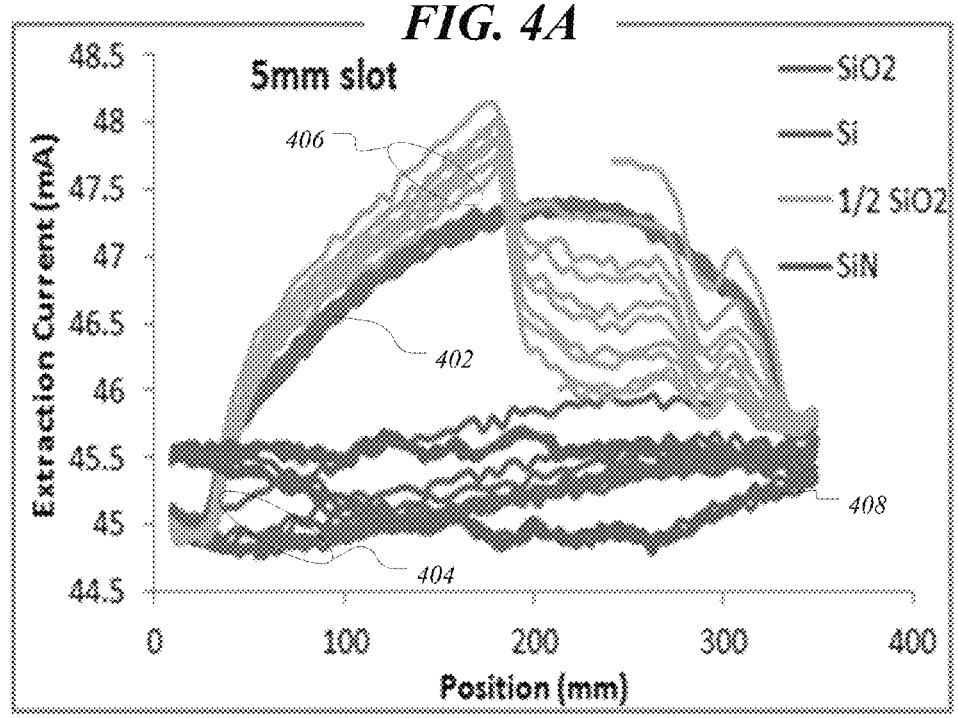
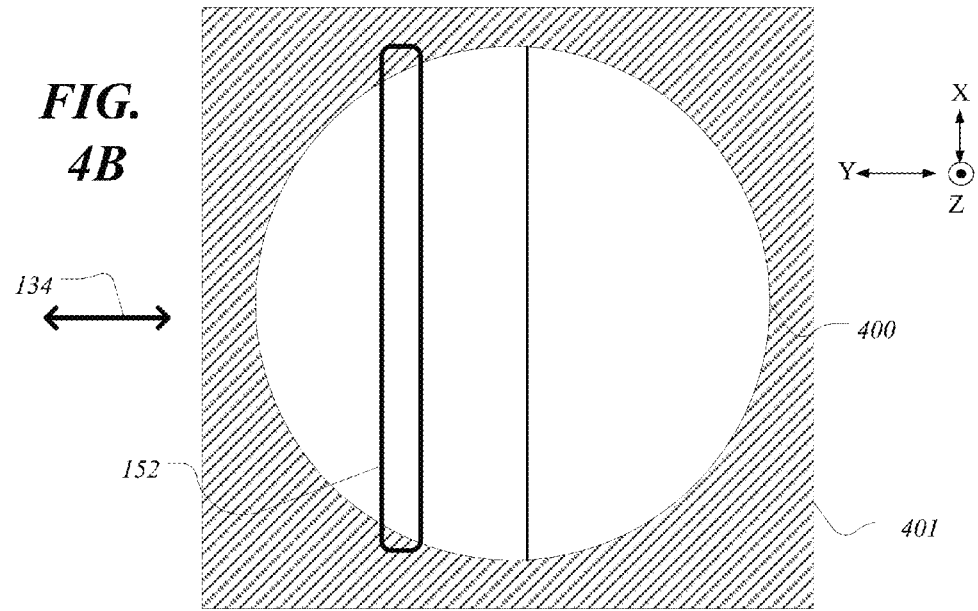

APPARATUS AND METHOD FOR ENDPOINT DETECTION

FIELD

The present embodiments relate to processing apparatus and methods, and more particularly, to components and methods to control processing in plasma and ion beam systems.

BACKGROUND

In the present day, various types of processing apparatus are employed to treat or process substrates with ions. For processing substrates such as semiconductor substrates, ions may be used to etch layers or features on a substrate. Ions may also be used to deposit a layer or structures on a substrate, to implant a species into a substrate, or to amorphize a substrate. Techniques have also been developed to monitor processing of a substrate in order to control the processing of a substrate.

In known techniques for etching a substrate, such as reactive ion etching (RIE), etch stop layers may be provided within a substrate to reduce etching rate so etching may be ended at a target region or depth of the substrate. Etching of a layer or layers within a substrate may also be controlled by a timed etch approach. In timed etching, a thickness of a layer and etch rate of the layer may be known or determined a priori, so etching of a substrate is halted at a predetermined time. Such a timed etch method does not account for variation in layer thickness between substrates, or variation in etch rate of a processing apparatus over time.

Accordingly, techniques to monitor a substrate during processing have been developed to measure so-called process endpoint. For example, during etching of a given layer by ions, optical emission spectroscopy has been deployed to monitor changes in chemical species emitted into the gas phase during etching. Thus, a change in intensity of a signal from a given element may indicate when a layer has been removed. Other techniques such as in-situ spectroscopic ellipsometry may be employed to monitor removal of dielectric films, for example. In the aforementioned techniques, disadvantageously, background signals may need to be filtered to properly interpret when an endpoint is reached and the detection apparatus used to monitor such signals may entail extensive engineering for compatibility with a processing apparatus. With respect to these and other considerations the present improvements may have been needed.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus to control processing conditions for a substrate may include a current measurement component to perform a plurality of extraction current measurements for extraction current in a processing apparatus housing the substrate, the extraction current comprising ions extracted from a plasma and directed to the substrate; and an endpoint detection component comprising logic to generate an endpoint detection signal based upon a change in extraction current during the plurality of extraction current measurements.

In another embodiment, a processing apparatus may include an ion chamber generating ions; an extraction system to deliver the ions to a substrate, the ions comprising an extraction current; and a process control system. The process control system may include a current measurement component to perform a plurality of extraction current measurements for the extraction current, an endpoint detection component comprising logic to generate an endpoint detection signal based upon a change in the extraction current during the plurality of extraction current measurements, and a controller to send a control signal to adjust process conditions of the processing apparatus responsive to the endpoint detection signal.

In a further embodiment a method of treating a substrate in a processing apparatus may include generating a plasma; extracting ions from the plasma and directing the ions as processing ions to the substrate; monitoring an extraction current comprising the processing ions, the monitoring comprising performing a plurality of extraction current measurements to measure the extraction current at a plurality of instances; determining, based upon the monitoring the extraction current, an endpoint is reached; and sending a control signal to adjust processing conditions of the processing apparatus when the endpoint is reached.

BRIEF DESCRIPTION OF THE DRAWINGS

FIG. 2A, FIG. 2B and FIG. 2C show three different instances of processing a substrate 200 according to an embodiment of the disclosure;

FIG. 2D presents a curve representing extraction current as a function of time in accordance with the scenario generally illustrated in FIGS. 2A-2C;

FIG. 4A depicts further experimental data showing monitoring extraction current for different substrate systems;

FIG. 4B depicts the geometry for recording data of FIG. 4A; and

DETAILED DESCRIPTION

Figure 1A:
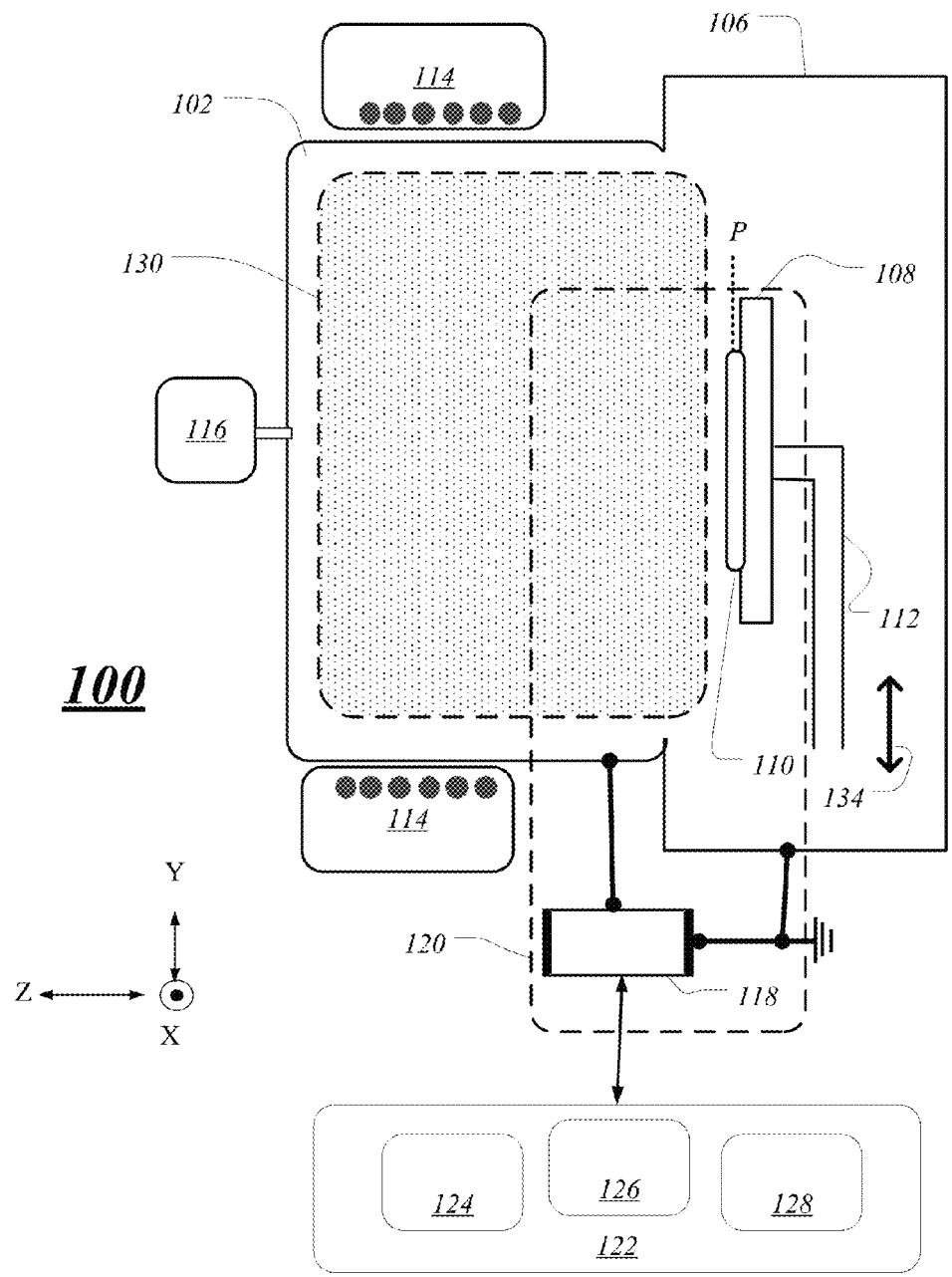
FIG. 1A illustrates a processing apparatus consistent with various embodiments of the disclosure.

The present embodiments will now be described more fully hereinafter with reference to the accompanying drawings, where some embodiments are shown. The subject matter of the present disclosure, may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein provide novel processing apparatus and methods to process substrates. Various embodiments facilitate endpoint detection in processing a substrate, meaning the detection when processing of a given layer or material is complete or nearing completion. Endpoint detection may refer to determining a given layer being etched has been removed, or a given portion of a substrate has been amorphized, a given amount of material has been deposited on a substrate. Various embodiments may further facilitate monitoring of different changes in a substrate, and in particular changes in the surface characteristics of a substrate. Various embodiments involve monitoring of a substrate being processed in a plasma based system, an ion beam system, or other ion system where ions are directed to the substrate. Various embodiments involve monitoring extraction current in processing systems in order to determine substrate changes during processing by a plasma or ion beam system. Particular embodiments may involve monitoring extraction current in a processing system and adjusting processing conditions in the processing system in response to changes in the extraction current.

FIG. 1A illustrates a processing apparatus 100 consistent with various embodiments of the disclosure. The processing apparatus 100 includes a plasma chamber 102 and a process chamber 106, where the process chamber 106 may house a substrate holder 108 and substrate 110. In some embodiments the plasma chamber 102 and process chamber 106 may be separate chambers, while in other embodiments a given chamber may house a plasma and substrate. As illustrated, the substrate holder 108 may be movable with the aid of a stage 112 along the X-axis, Y-axis, or Z-axis, or any combination thereof with respect to the Cartesian coordinate system shown. For example, the stage 112 may include a scanner (not separately shown) to move the substrate holder 108 along the scan direction 134 parallel to the Y-axis. In various embodiments, the substrate holder 108 may be configured to rotate within the X-Y plane or tilt with respect to the X-Y plane.

The processing apparatus 100 also includes a plasma source 114. The plasma source 114 may be used to generate a plasma 130 in the plasma chamber 102. For example, the plasma source 114 may, in various embodiments, be an in situ source or remote source, an inductively coupled plasma source, capacitively coupled plasma source, helicon source, microwave source, arc source, or any other type of plasma source. The embodiments are not limited in this context. In the example specifically illustrated in FIG. 1A, the plasma source may be an inductively coupled plasma source including a power supply and high frequency generator (not separately shown) as well as an applicator, such as a coil.

The processing apparatus 100 includes a gas source assembly 116 to supply gas to the plasma chamber 102. In operation, the processing apparatus 100 may generate the plasma 130 as shown, including ions for processing the substrate 110.

As further shown in FIG. 1A, the processing apparatus 100 may include an extraction system 120. As illustrated, the extraction system 120 may include an extraction supply 118 and substrate 110 as well as substrate holder 108. The extraction system 120 may function to extract ions (not shown) generated in the plasma chamber 102 and direct the ions to the substrate 110. The extraction system 120 may function similarly to known extraction systems including those used in plasma deposition apparatus (PLAD), plasma immersion apparatus or similar apparatus. The extraction supply 118 may establish a potential (voltage) between the substrate 110 the plasma chamber 102 in order to attract ions from a plasma (not shown) to the substrate 110. Ions attracted to the substrate 110 may form part of an extraction current during processing of the substrate 110. In one example, the plasma chamber 102 may be biased positively with respect to ground by the extraction supply 118, while the substrate holder 108 is grounded, resulting in the attraction of positive ions to the substrate 110 from a plasma in plasma chamber 102. In another example, the extraction supply 118 may bias the substrate holder 108 (substrate 110) negatively with respect to ground, while the plasma chamber 102 is grounded. In either case, an extraction current including positive ions is generated where the positive ions travel from the plasma chamber 102 to substrate 110.

In some embodiments, the extraction supply 118 may include a pulse generator (not shown) to output a pulse waveform, where the pulse waveform generates the extraction current as a plurality of extraction current pulses having a pulse period characterized by an ON portion and OFF portion. During an ON portion a high potential may be established between substrate 110 and plasma chamber 102, such as +200 V to +20 kV. During an OFF portion, the potential of plasma chamber 102 and substrate 110 may be the same.

As suggested in FIG. 1A, ions from the plasma 130 may impinge on the substrate 110 over the entirety of the surface of the substrate facing the plasma 130 at a given instance. In other embodiments where a separate plasma chamber is provided from a process chamber, ions may be provided to a substrate 110 over a smaller portion of the substrate 110 at any given instance.

The processing apparatus 100 further may include a process control system 122. The process control system 122 may include a current measurement component 124 to perform a plurality of extraction current measurements for extraction current during processing of the substrate 110. In some examples, the current measurement component 124 may form part of a system arranged to monitor various settings of the processing apparatus 100, including extraction current, extraction voltage, plasma power, and so forth.

The process control system 122 may also include an endpoint detection component 128 including logic to generate an endpoint detection signal based upon a change in extraction current occurring during the plurality of extraction current measurements. In some instances, the logic of endpoint detection component 128 may be implemented in hardware, firmware, or a combination of hardware and software. The embodiments are not limited in this context.

The process control system 122 may further include a controller 126, where the controller 126 may send a control signal to adjust process conditions of the processing apparatus 100 responsive to an endpoint detection signal. The controller 126 may be implemented in hardware, firmware, a combination of hardware and software. The controller 126 may include controller logic configured to adjust at least one of ion energy of the ion beam and ion density in the plasma chamber responsive to the endpoint detection signal. The embodiments are not limited in this context. As one example, a control signal may be sent from the process control system 122 to the extraction system 120 to turn off extraction voltage when an endpoint is detected from changes in the extraction current.

Figure 1B:
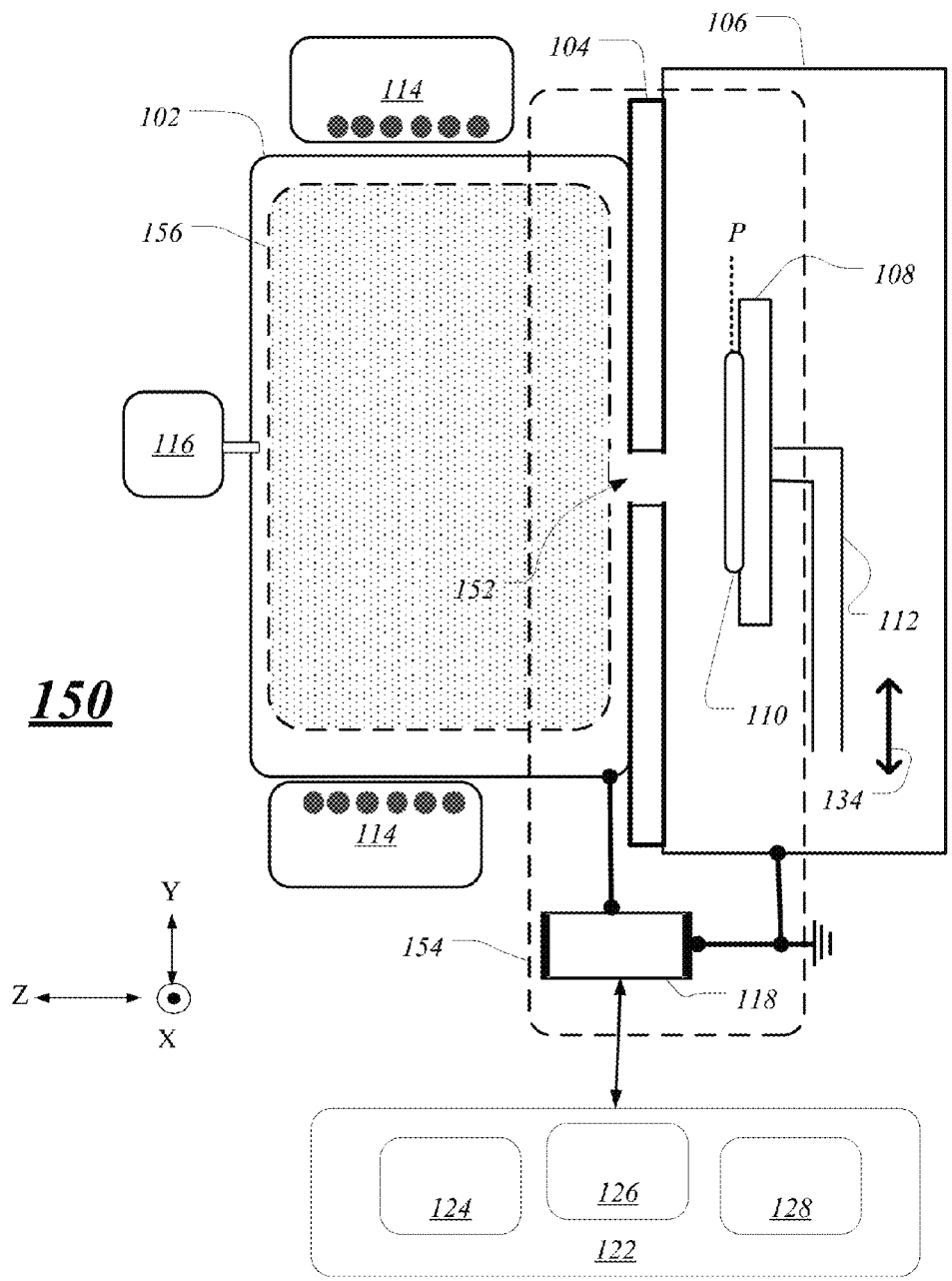
FIG. 1B illustrates a processing apparatus consistent with various additional embodiments of the disclosure.

FIG. 1B illustrates a processing apparatus 150 consistent with various additional embodiments of the disclosure. In this example, the processing apparatus 150 may share the same components with processing apparatus 100 except as otherwise noted. In particular, the processing apparatus 150 includes an extraction plate 104 disposed between the plasma chamber 102 and the process chamber 106. The extraction plate 104 may form part of an extraction system 154 also including the aforementioned components of extraction system 120. The operation of extraction system 154 is detailed below with respect to FIG. 1C. As shown in FIG. 1B, the extraction plate 104 may include an extraction aperture 152, so ions are extracted from a plasma 156 and provided to the substrate 110 as an ion beam.

Figure 1C:
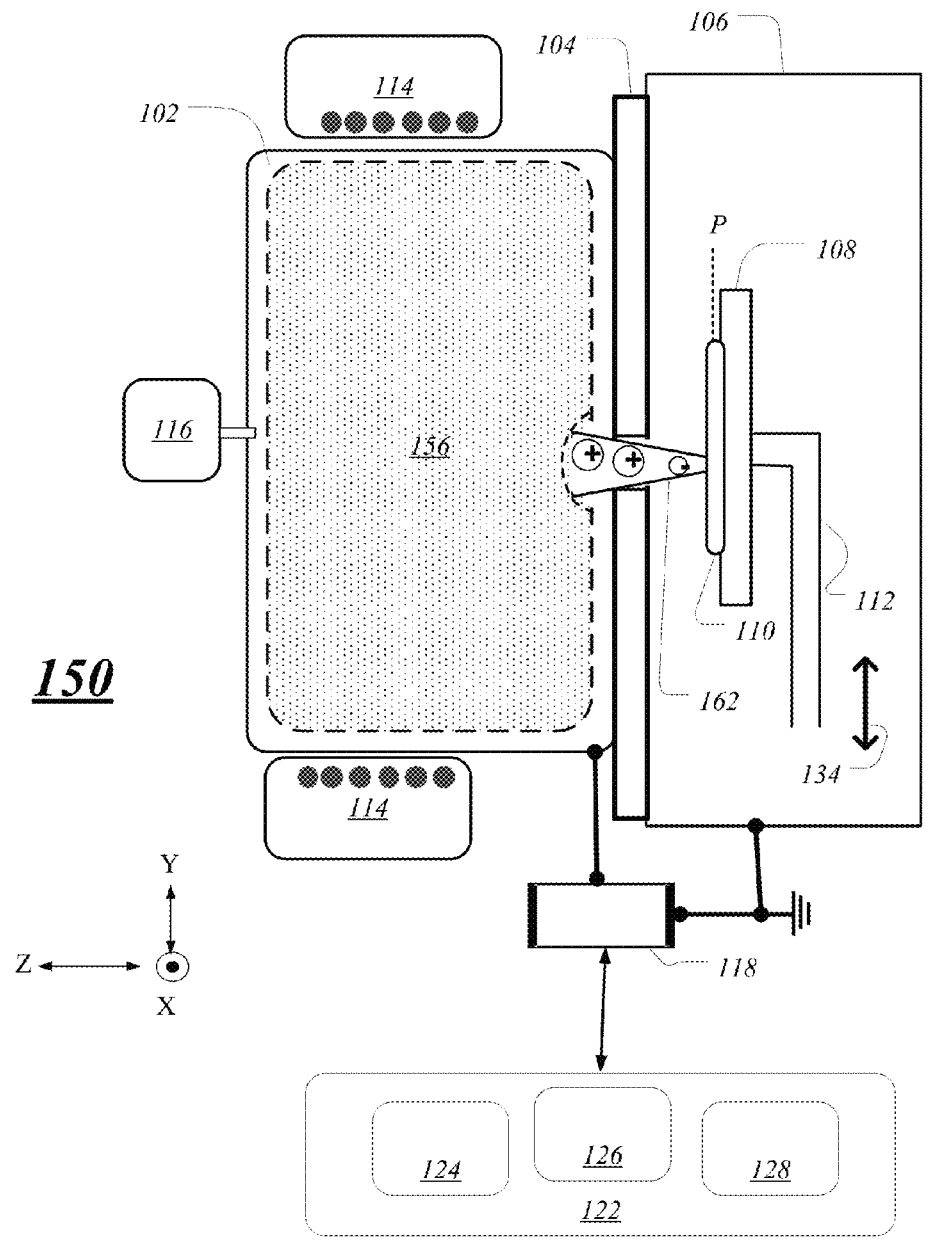
FIG. 1C, there is shown one instance of operation of the processing apparatus of FIG. 2B consistent with various embodiments of the disclosure.

Turning now to FIG. 1C, there is shown one instance of operation of the processing apparatus 150 consistent with various embodiments of the disclosure. In this example, the extraction system 154 (see FIG. 1B) may generate an extraction voltage between the plasma chamber 102 and substrate holder 108 as described above. In one implementation, the extraction system 154 may charge up the plasma chamber 102 so the plasma chamber 102 is placed at a positive voltage with respect to ground, such as +200 V to +20 kV. The embodiments are not limited in this context. The substrate holder 108 and substrate 110 may be grounded in this implementation. The plasma potential of the plasma 156 may be several volts to several tens of volts more positive than the potential of plasma chamber 102. Accordingly, positive ions shown as "+" symbols may be accelerated from the plasma 156 and impinge upon the substrate 110 as an ion beam 162 having an energy determined by the difference between the plasma potential of plasma 156 and ground. As illustrated in FIG. 1C, the ion beam 162 may impact just a portion of the substrate 110 at a given instance. The substrate holder 108 may be scanned along a scan direction shown as the scan direction 134 to expose different portions of the substrate 110 to the ion beam 162.

The positive ions of ion beam 162 may from part of an extraction current, where the extraction current may also include electrons. Under steady state conditions, when the ion beam 162 impinges upon the substrate 110 secondary electrons may be emitted from the substrate 110. The net extraction current measured by process control system 122 may accordingly include the contribution of positive ions in ion beam 162 accelerated toward the substrate 110 as well as electrons emitted from substrate 110.

During processing of the substrate 110, the processing control system 122 may monitor the extraction current when the ion beam 162 impacts the substrate 110. In accordance with various embodiments, as the ion beam 162 continues to impact substrate 110, changes in extraction current in the processing apparatus 150 may occur for various reasons. In one example, if the substrate 110 includes multiple layers made of different materials, the ion beam 162 may etch through a first layer at a given instance, exposing a second layer.

When the second layer is exposed the second layer may present different material properties to the ion beam 162 than the first layer. The second layer may have different secondary emission coefficient, different dielectric properties, or different density, for example. Any of these differences may lead to a change in the measured extraction current and the ion beam 162 impacts the second layer. In one example, the secondary electron emission characteristic of the second layer may differ from the first layer, leading to a different amount of secondary electron current being generated at the surface of the substrate 110. This may be detected by the current measurement component 124, triggering the endpoint detection component 128 to determine a process endpoint has been reached. Subsequently, the controller 126 may adjust operation of the processing apparatus 150, for example, by sending a control signal to terminate etching of the substrate 110. The extraction system 154 may then turn off extraction voltage between the plasma chamber 102 and substrate holder 108.

Turning now to FIG. 2A, FIG. 2B and FIG. 2C, there are shown three different instances of processing a substrate 200 according to an embodiment of the disclosure. The substrate 200 may include a base 202, lower layer 204, and upper layer 206. As shown, ions 210 are provided to process the substrate 200. In one example the ions 210 may be provided as etching ions for removing material from substrate 200. In FIG. 2A there is shown a first instance T1 where the ions 210 impact the upper layer 206. The ions 210 may be positive ions impacting the upper layer 206, generating a first secondary electron current, shown as secondary electrons 212. Material forming the upper layer 206 may be characterized by a specific secondary electron emission coefficient, expressed as a ratio of secondary electrons emitted per ion impacting the material in one example. Accordingly, when the ions 210 impact just the upper layer 206, the amount of secondary electron current may be constant for a given current of the ions 210.

Turning to FIG. 2B, there is shown an instance T2 where nearly the full amount of the upper layer 206 has been removed. In this instance the ions 210 may impact remaining portions of the upper layer 206 as well as outer portions of the lower layer 208. In one example, the upper layer 206 may be silicon oxide while the lower layer 204 may be silicon nitride. The upper layer 206 may exhibit a different secondary electron emission coefficient or different dielectric constant than the respective values of secondary electron emission coefficient or dielectric constant of the lower layer 204, to name two properties. If the secondary electron emission coefficient differs between upper layer 206 and lower layer 204, the amount of secondary electrons 212 at the instance shown in FIG. 2B may differ from the amount shown in FIG. 2A. This may change the measured extraction current determined from a combination of ion current, such as positive ion current, and electron current.

Turning to FIG. 2C there is shown an instance T3 where the upper layer 206 has been completely removed and the ions 210 are etching just the lower layer 204. Accordingly, the amount of secondary electrons 212 at the instance shown in FIG. 2C may differ from the amount shown in FIG. 2A, as well as the amount shown in FIG. 2B.

FIG. 2D presents a curve 220 representing extraction current as a function of time in accordance with the scenario generally illustrated in FIGS. 2A-2C from T1 to T3. As shown the value of the extraction current decreases as etching proceeds from instances where the ions 210 (see FIG. 2C) impact merely the upper layer 206, the upper layer 206 and lower layer 204, and subsequently just the lower layer 204. In accordance with different embodiments, endpoint detection for the scenario of FIGS. 2A-2D may proceed in different manners. For example, an endpoint may be determined based upon when extraction current begins to decrease at the instance T2 or at an instance T3 where extraction current has decreased to a level characteristic of the lower layer 204. In other examples, an endpoint may be determined based upon when a rate of change of the extraction current as a function of time exceeds a threshold.

Figure 3A:
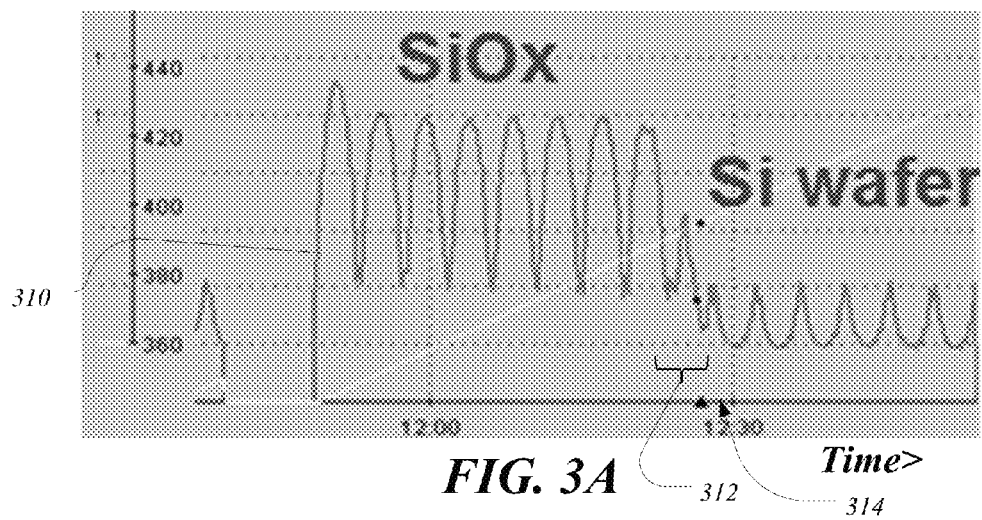
FIG. 3A provides an example of experimental data recorded for a processing apparatus arranged according to an embodiment of the disclosure.
Figure 3B:
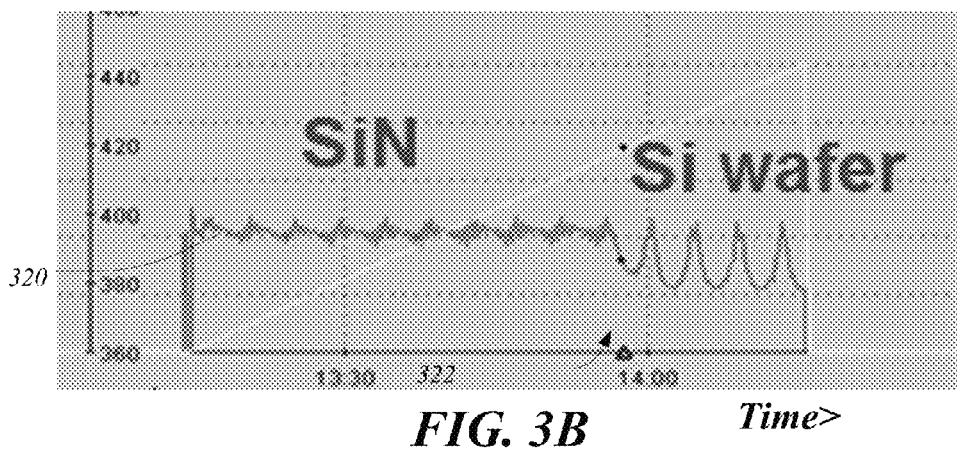
FIG. 3B provides another example of experimental data recorded for a processing apparatus arranged according to an embodiment of the disclosure.
Figure 3C:
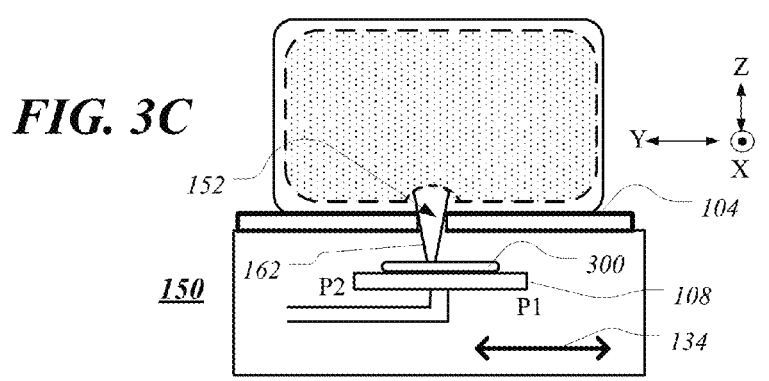
FIG. 3C depicts an arrangement of an apparatus for generating the data of FIGS. 3A and 3B.
Figure 3D:
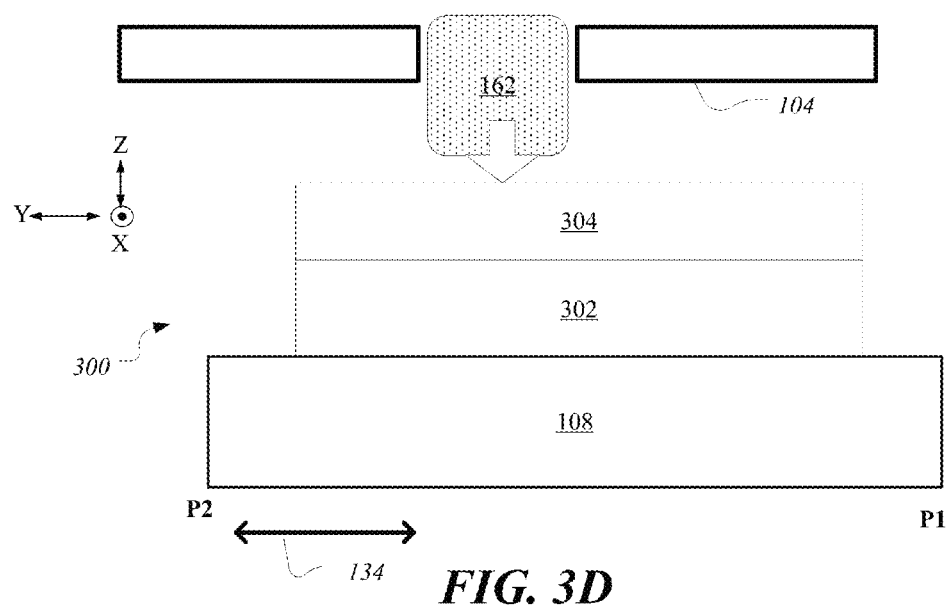
FIG. 3D depicts details of the geometry for generating the data of FIGS. 3A and 3B.

FIG. 3A provides an example of experimental data recorded for a processing apparatus arranged according to an embodiment of the disclosure. In this example, the processing apparatus is arranged generally as described above for processing apparatus 150, also shown in FIG. 3C. The data shown in FIG. 3A is recorded for etching of a substrate 300 having a layer stack generally depicted in FIG. 3D. In FIG. 3D there is shown the substrate 300 includes a lower layer 302 and upper layer 304. The ion beam 162 is directed to the substrate 300 and etches the different layers of substrate 300. In the examples of FIG. 3A and FIG. 3B the substrate holder 108 of processing apparatus 150 is scanned back and forth between points P1 and P2 in a plurality of scan cycles while the ion beam 162 etches the substrate 300, as depicted in FIG. 3C. As the substrate holder 108 (substrate 110) is scanned back and forth, different portions of the substrate 110 and substrate holder 108 may be exposed to the ion beam 162 at different instances. For example, at some instances the ion beam 162 may impact just the substrate 110 while at other instances the ion beam 162 may impact the substrate 110 and substrate holder 108. The substrate holder 108 may exhibit a different secondary electron emission coefficient or different dielectric constant than the substrate 110. Accordingly, because the fraction of the ion beam 162 impacting substrate 110 as opposed to substrate holder 108 may vary with time, the extraction current may also vary as a function of time.

Returning to FIG. 3A, an extraction current curve 310 is shown, representing measured extraction current as a function of time for a period of approximately one hour. In this example, the extraction plate 104 has an extraction aperture 152 having an aperture width of 5 mm along the Y-axis, as shown in FIG. 1B. In some instances the extraction aperture 152 may be an elongated aperture having a length along a long axis (represented by the X-axis) longer than the width along the Y-axis, as shown, for example, at FIG. 4B. The substrate 110 is scanned with respect to extraction aperture 152 where the duration of a scan between point P1 and P2 is several minutes. During a given scan, the extraction current increases as the ion beam 162 impacts the center of the substrate 110 and decreases as the ion beam 162 impacts toward edges of the substrate 110 where a larger fraction of the ion beam 162 impacts the substrate holder 108. This causes an oscillation in the measured extraction current as shown by the extraction current curve 310.

Figure 3E:
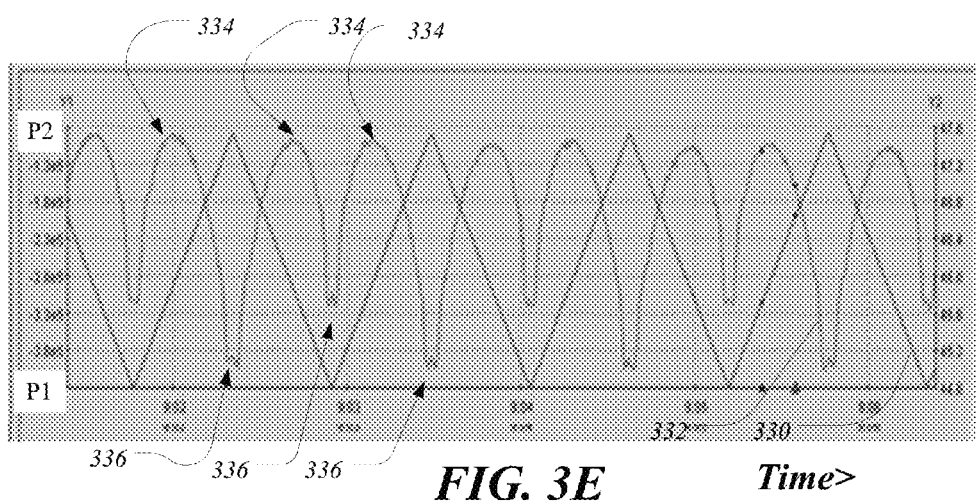
FIG. 3E depicts further exemplary experimental data showing extraction current as a function of time for etching of silicon oxide.

FIG. 3E depicts further exemplary experimental data showing extraction current as a function of time for etching of silicon oxide, further illustrating this feature. In this example, the extraction geometry may be the same as the extraction geometry for FIG. 3B. In FIG. 3E there is shown a position curve 330 depicting the relative position of the substrate holder 108 with respect to the extraction aperture 152. In this experiment the substrate holder is translated back and forth parallel to the Y-axis at a constant speed. Thus, the position curve 330 exhibits a sawtooth behavior with time. The extraction current curve 332 exhibits a series of peaks 334 and troughs 336. The troughs 336 correspond to instances when the extraction aperture 152 is aligned with position P1 or position P2 where a larger fraction of the ion beam 162 impacts the substrate holder 108. The peaks 334 correspond to instances when the extraction aperture 152 is positioned over the middle of the substrate 110.

As further shown in FIG. 3A, over a time span 312 spanning several minutes, the value of extraction current decreases sharply. This decrease in extraction current represents a range of time where the upper layer 304, in this case silicon oxide, is completely removed, exposing the lower layer 302, in this case silicon. Subsequently, the ion beam 162 etches just a silicon surface while the substrate holder 108 is scanned with respect to the ion beam 162. While the value of extraction current continues to fluctuate, the average value of extraction current and peak value of extraction current is significantly lower than the corresponding values measured before the time span 312.

In the example of FIG. 3A an endpoint determination may be made based upon different procedures. As the substrate 300 is scanned, the complete removal of a first layer by the ion beam 162 may occur at different instances. Accordingly, the endpoint may be determined at an instance when the measured extraction current has been reduced by a predetermined amount in all positions, such as at the time 314. Other procedures employing other criteria are possible for determining an endpoint.

Turning to FIG. 3B, an extraction current curve 320 is shown, representing measured extraction current as a function of time for a period of approximately one hour. In this example, the extraction plate 104 also has an extraction aperture 152 having an aperture width of 5 mm along the Y-axis, as shown in FIG. 1B. The substrate 110 is scanned with respect to extraction aperture 152 where the duration of a scan between point P1 and P2 is several minutes. During a given scan, the extraction current increases slightly as the ion beam 162 impacts the middle of the substrate 110 and decreases as the ion beam 162 impacts toward edges of the substrate 110 where a larger fraction of the ion beam 162 impacts the substrate holder 108. As further shown in FIG. 3B, at a time 322 the value of extraction current decreases. This decrease in extraction current represents a time when the upper layer 304, in this case silicon nitride, is completely removed, exposing the lower layer 302, in this case silicon. Subsequently, the ion beam 162 etches just a silicon surface while the substrate holder 108 is scanned with respect to the ion beam 162. While the value of extraction current continues to fluctuate, the average value of extraction current is slightly lower (~2% lower) than before the time 322.

In sum, the data of FIGS. 3A and 3B illustrates another manner where endpoint detection may be performed according to different embodiments by monitoring extraction current during etching of a substrate using a scanned beam.

Turning now to FIG. 4A and FIG. 4B, there are shown further examples of monitoring extraction current to determine changes in a material at the outer surface of a substrate. In FIG. 4A there are shown a variety of experimental extraction voltage curves during ion beam etching of different substrate systems. In FIG. 4B there is shown a plan view of the geometry for etching a substrate consistent with the experimental data of FIG. 4A. In particular FIG. 4B illustrates a composite view depicting a projection of an extraction aperture 152 while the remainder of the extraction plate 104 is omitted for clarity. To generate the data of FIG. 4A, the substrate 400 and substrate holder 401 are scanned back and forth parallel to the Y-axis with respect to extraction aperture 152. In different experiments the substrate 400 may represent a full wafer having a surface composed just of silicon, silicon oxide, or silicon nitride. The substrate 400 may alternatively represent a wafer having a left portion having an outermost layer of silicon oxide, and a right portion made of silicon, as suggested in the FIG. 4B.

Returning to FIG. 4A the experimental data shown plots extraction current as a function of substrate position in millimeters where the position at 30 millimeters represents the arrangement when one edge of a substrate is located underneath the extraction aperture 152, and the position at 330 millimeters represents another edge of the substrate being located underneath the extraction aperture 152. The curves 408 represent scans where the substrate 400 has an outer layer of silicon nitride. The extraction current shown by curves 408 remains relatively constant as a function of position, exhibiting a slight hysteresis. The extraction current for silicon is shown in the curves 404, and exhibits a slight peak in the middle, superimposed on a slight upward skew of extraction current level towards the right. The extraction current for silicon oxide is exhibited by the curves 402, showing a pronounced peak in the middle of the substrate. The extraction current increases from approximately 45 milliamps on either extreme of the substrate to approximately 47.3 milliamps in the middle region. The curves 406 represent extraction current measured during scans where the substrate 400 includes a left portion having a silicon oxide outer layer and a right portion having a silicon outer surface. The boundary between the silicon oxide region and silicon region is located at approximately the 200 millimeter position. As illustrated, a steep decrease in extraction current is observed as the ion beam is scanned across the boundary.

Although the aforementioned examples focus on detection of endpoint when an ion beam is provided to etch a substrate, various other embodiments involve endpoint detection when a substrate is altered in other ways, including the deposition of a layer, amorphizing of a substrate, or doping of a substrate. As an example, an ion beam including dopant ions may be extracted from a plasma chamber and implanted into a semiconductor substrate in a manner altering the electronic properties of the semiconductor substrate over time. The extraction current may accordingly be monitored in order to determine when a process endpoint has been reached. In one example, a predetermined change in extraction current may be deemed to indicate when a target amount of dopant has been implanted into the semiconductor substrate.

Figure 5:
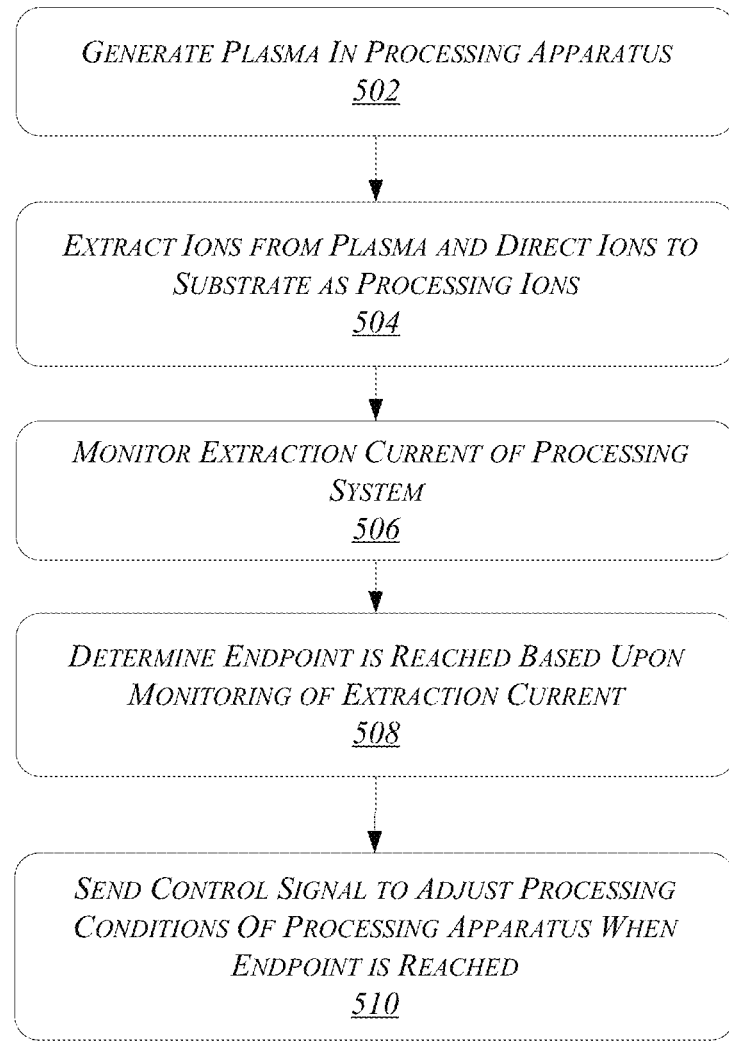
FIG. 5 depicts an exemplary process flow according to another embodiment of the disclosure.

FIG. 5 depicts an exemplary process flow 500 according to further embodiments of the disclosure. At block 502 a plasma is generated. The plasma may be generated in a processing system including a plasma chamber housing a substrate. In other examples, the plasma may be generated in a plasma chamber separate from a process chamber housing a substrate. At block 504, ions are extracted from the plasma and directed to the substrate as processing ions. The ions may be extracted from the plasma by establishing a potential difference between a plasma chamber and substrate. The processing ions may etch the substrate, may deposit a layer on the substrate, may electronically dope the substrate, may amorphize the substrate, or otherwise alter the substrate as a function of time. At block 506, an extraction current of the processing system including the processing ions is monitored. The monitoring may include performing a plurality of extraction current measurements to measure the extraction current at a plurality of different instances. At block 508, the reaching of an endpoint may be determined based upon the monitoring the extraction current. In some examples, the endpoint may be determined by an increase in the value of extraction current, a decrease in value of extraction current, or when a rate of change of extraction current as a function of time reaches a threshold. At block 510, a control signal is sent to adjust processing conditions of the processing apparatus when the endpoint is reached. The adjusting of processing conditions may involve, for example, termination of extraction of ions from the plasma.

An advantage afforded by the present embodiments includes the ability to detect a process endpoint while not having to incorporate extra signal measurement equipment outside of a process chamber. Another advantage is avoiding incorporation of extra detectors within a processing system near a substrate where the presence of the extra detectors may interfere in processing of a substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus to control processing conditions for a substrate, comprising:
   a plasma chamber;
   an extraction system, the extraction system comprising an extraction plate, adjacent the plasma chamber, the extraction plate having an extraction aperture to extract ions from the plasma chamber and to provide the ions as an ion beam to the substrate;
   a current measurement component to perform a plurality of extraction current measurements for extraction current in a process chamber, disposed on an opposite side of the extraction plate from the plasma chamber and housing the substrate, the extraction current comprising the ions and electron current generated from the substrate; and
   an endpoint detection component comprising logic to generate an endpoint detection signal based upon a change in the extraction current that is detected by the current measurement component during the plurality of extraction current measurements.

2. The apparatus of claim 1 further comprising a controller to send a control signal to adjust process conditions of the processing apparatus responsive to the endpoint detection signal.

3. The apparatus of claim 1, further comprising:
   an extraction supply to generate the extraction current.

4. The apparatus of claim 3, wherein the change in extraction current comprises a change in secondary electron emission from a surface of the substrate.

5. The apparatus of claim 3, further comprising:
   a scanner configured to scan the substrate with respect to the extraction aperture along a scan direction.

6. The apparatus of claim 5, wherein the extraction aperture has a long axis, wherein the scan direction is perpendicular to the long axis.

7. The apparatus of claim 5, wherein the scanner is configured to scan the substrate back and forth for a plurality of scan cycles between a first point and second point.

8. The apparatus of claim 1, further comprising:
   a pulse generator to output a pulse waveform, the pulse waveform generating the extraction current as a plurality of extraction current pulses having a pulse period characterized by an ON portion and OFF portion.

9. A processing apparatus, comprising:
   a plasma chamber generating ions;

an extraction system to extract the ions from the plasma chamber and deliver the ions to a substrate, the ions forming a portion of an extraction current; and a process control system, comprising:

a current measurement component to perform a plurality of extraction current measurements for the extraction current; and an endpoint detection component comprising logic to generate an endpoint detection signal based upon a change in the extraction current that is detected by the current measurement component during the plurality of extraction current measurements; and a controller to send a control signal to adjust process conditions of the processing apparatus responsive to the endpoint detection signal, wherein the extraction system comprising an extraction plate adjacent the plasma chamber and having an extraction aperture to direct an ion beam to the substrate.

10. The processing apparatus of claim 9, the apparatus further comprising a scanner configured to scan the substrate along a scan direction between a first point and a second point, wherein extraction current varies between the first point and second point.

11. The apparatus of claim 9, wherein the extraction system comprises the extraction plate and substrate, wherein the extraction current comprises an ion current and electron current at the substrate.

12. The apparatus of claim 9, wherein the controller comprises controller logic configured to adjust at least one of ion energy of the ion beam and ion density in the plasma chamber responsive to the endpoint detection signal.

13. An apparatus to control processing conditions for a substrate, comprising:

a current measurement component to perform a plurality of extraction current measurements for extraction current in a processing apparatus housing the substrate, the extraction current comprising ions extracted from a plasma and directed to the substrate and electron current generated from the substrate;

an endpoint detection component comprising logic to generate an endpoint detection signal based upon a change in the extraction current that is detected by the current measurement component during the plurality of extraction current measurements;

a plasma source to generate the plasma; an extraction supply to generate the extraction current;

a plasma chamber to house the plasma;

an extraction plate adjacent the plasma chamber and having an extraction aperture to extract the ions from the plasma and provide the ions as an ion beam to the substrate; and a scanner configured to scan the substrate with respect to the extraction aperture along a scan direction, wherein the extraction aperture has a long axis, wherein the scan direction is perpendicular to the long axis.

* * * * *